United States Patent [19]

Jansen

[11] 4,313,215

[45] Jan. 26, 1982

[54] CIRCUIT FOR ATTENUATING DISTURBING NOISE SIGNALS

[75] Inventor: Winfried Jansen, Hasloh, Fed. Rep. of Germany

[73] Assignee: U.S. Philips Corporation, New York, N.Y.

[21] Appl. No.: 127,712

[22] Filed: Mar. 6, 1980

[30] Foreign Application Priority Data

Mar. 10, 1979 [DE] Fed. Rep. of Germany ....... 2909520

[51] Int. Cl.³ .............................................. H04B 1/10
[52] U.S. Cl. ................... 455/212; 455/219; 455/235; 455/244; 455/249; 455/303
[58] Field of Search ................ 455/205, 206, 211–213, 455/217, 219, 221, 222, 235, 244, 245, 249, 303

[56] References Cited

U.S. PATENT DOCUMENTS

| | | | |
|---|---|---|---|
| 3,769,592 | 10/1973 | Espe | 455/222 |
| 4,132,953 | 1/1979 | Martin | 455/212 |
| 4,156,202 | 5/1979 | Takahashi | 455/303 |

FOREIGN PATENT DOCUMENTS 2602908 7/1977 Fed. Rep. of Germany ...... 455/212

Primary Examiner—Marc E. Bookbinder
Attorney, Agent, or Firm—Thomas A. Briody; William J. Streeter; Edward W. Goodman

[57] ABSTRACT

In the circuit according to the invention the entire FM-demodulator output signal is evaluated, that is to say the sum of the low-frequency signal and the d.c. voltage (AFC) component. The absolute value is produced therefrom and an attenuator circuit becomes operative in the low-frequency channel when the absolute value of the demodulator output signal exceeds a predetermined threshold value. This not only enables the suppression of spurious receptions, but also the suppression of intermediate receptions (the reception of two transmitters on the filter edges) and surging of noise. The circuit can be easily implemented in integrated circuit technique.

6 Claims, 10 Drawing Figures

CIRCUIT FOR ATTENUATING DISTURBING NOISE SIGNALS

BACKGROUND OF THE INVENTION

The invention relates to a circuit for attenuating noise signals in a FM receiver, wherein the output signal of a FM demodulator is applied to an absolute value function signal generator from which is derived a control signal for an attenuator which increases the attenuation in the signal channel above a threshold value of the absolute value of the demodulator output signal.

Such a circuit is described in the German Offenlegungsschrift No. 2,602,908.

In this German Offenlegungsschrift the amount generator consists of a rectifier bridge to the output of which a capacitor is connected. Due to the relatively high demodulator output resistance and a series resistor, the capacitor can, however, only be charged relatively slowly. Also discharging the capacitor can only be effected slowly, so that the capacitor, whose voltage switches an attenuator through an operational amplifier, is charged to the average value of the demodulator output voltage. This average value constitutes the so-called AFC-voltage, that is to say a voltage which is proportional to the deviation between the center frequency of the FM demodulator and the carrier frequency of a received transmitter. It is, however, not possible to eliminate all the different kinds of disturbing noise signals with this circuit. The disturbing noise signals can be divided into three groups:

(a) disturbing noise signals which are produced when no transmitter signal is received, that is to say when, within the passband of the intermediate frequency amplifier of the receiver, no transmitter signal is received or only transmitter signals which are so weak that the useful low-frequency signal obtained is disturbed too much by the noise.

In such a case the signal channel supplies a strong noise being only little lower than the signal obtained in the case of correct tuning to a correct received transmitter signal which is modulated with a maximum deviation. This type of disturbing noise will be denoted as noise surging hereinafter.

The known circuit cannot suppress this surge of noise by means of the circuit described in the opening paragraph. Therefore, a voltage which is derived from the received field strength is here additionally used, the attenuation in the signal channel being increased when the field strength decreases.

(b) Disturbing noise signals which are produced when a transmitter signal is received on the edges of the intermediate frequency filter. This is shown in FIG. 1. FIG. 1 is a schematical representation of the curve 1 of the intermediate frequency amplifier response. The central frequency is at the frequency f0. When a transmitter having a carrier frequency f1 or f2 is received, considerable distortions are produced which may be heard considerably louder than the signal at a correct tuning to this transmitter carrier frequency.

This type of disturbing noise signals, which will be denoted as spurious reception hereinafter, can be effectively suppressed by means of the known circuit, as a d.c. voltage is generated, being dependent of the deviation between f0, f2 and f0, f1, respectively, which can be used to switch off the signal channel.

(c) Disturbing noise signals which are produced when the carrier frequencies of two transmitter signals coincide with the filter edges of the intermediate frequency filter (in this case (FIG. 1) the carrier frequency of one transmitter is at, for example f1 and the carrier frequency of the other transmitter at, for example, f2). This type of disturbing noise signals, which will be denoted intermediate reception hereinafter, can only be partly suppressed by the known circuit as, on the one hand, the received field strength is large whereas, on the other hand, the AFC-signal which is generated on tuning to a frequency located in f1 and f2—depending on the position of f1 and f2 and of the received field strength relative to f0—can always take the value zero (that is to say the AFC-voltage passes through zero and changes its sign during tuning), so that at least in this case the intermediate reception becomes audible when tuning the receiver.

SUMMARY OF THE INVENTION

It is an object of the invention to provide a circuit which enables the suppression of the surge of noise, the spurious reception and the intermediate reception by evaluating one signal only and which can furthermore be easily implemented as an integrated circuit. According to the invention, starting from a circuit of a type described in the opening paragraph, this is accomplished by arranging a circuit for forming the maximum value of the absolute value of the demodulator output signal between the output of the FM demodulator and the control input of the attenuator; by deriving the control signal for the attenuator from this maximum value and by designing the circuit such that, at an increase of the maximum value, the control signal varies with a considerably smaller time constant than at a decrease of a maximum value.

The output signal of a FM demodulator is composed of a desired and a low-frequency component, respectively, which represents the information to be transmitted, and a d.c. voltage (AFC) component which represents the deviation between the carrier frequency and the central frequency of the FM demodulator and of the intermediate frequency field, respectively. In accordance with the invention both components of the demodulator output signal are used and required.

Both components are indeed also used in the circuit according to the German Offenlegungsschrift 2,602,908, but only the d.c. voltage (AFC) component is required, whereas the low-frequency component does not become active as the output signal is smoothed as a result of the capacitor at the output of the rectifier bridge and of the series resistor arranged before it, and also of the considerable output resistance of the FM demodulator.

So the maximum value of the absolute value of the demodulator output signal corresponds to the largest deviation of the instantaneous value of the frequency of the demodulator input signal with respect to the central frequency of the FM demodulator. The exceeding of this frequency deviation of a predetermined upper limit value—for example as a result of noise surging, spurious reception or intermediate reception—is a criterion for the presence of a disturbing noise signal as, on accurate tuning to a transmitter frequency, the instantaneous value of a signal frequency which is converted to the intermediate frequency band can only deviate for a certain amount—the frequency deviation—from the central and the carrier frequencies, respectively. For FM reception this deviation is not more than 75 kHz.

In order to prevent the circuit for the attenuation of disturbing noise signals from being operative only during the maximum value of the frequency deviation, the controlled signal for controlling the attenuator may, at a decrease of the maximum value, follow this value with only a comparatively large time constant. On the other hand the control signal must be able to follow an increase of the maximum value relatively rapidly, so that also maximum values which are active only for a short period of time may trigger the circuit.

In a further embodiment of the invention measures are therefore taken to ensure that the time constant with which the control signal follows a decrease of the maximum value is at least five times, and preferably twenty times larger than the time constant with which the control signal follows an increase of the maximum value.

For a (non-professional) FM receiver designed for permanent use, the first mentioned (decay) time constant may be 200 msec. and the second (response) time constant may be 3 msec. The decay time constant should preferably, if possible, not exceed 500 msec. as otherwise there is a risk that an in itself correct receivable transmitter is no longer audible during rapid tuning. The response time constant should preferably be not too small as otherwise non-recurrent brief noise voltages may cause the circuit to respond.

For FM car radio receivers, the decay time constant should preferably be less than (0.5 msec to 10 msec) as during operation the received field strength may rapidly and strongly vary ("fence effect"), so that with large decay time constants in such a receiving condition the reception would constantly be suppressed or attenuated. The response time constant must be correspondingly smaller—in the microsecond range—; the lower limit is then determined by the width of the passband of the intermediate frequency filter.

In principle, it would be possible to generate the absolute value and the maximum value of the demodulator output signal by means of one and the same circuit. Likewise, the maximum value of the absolute value may alternatively be generated by deriving the maximum value from the non-inverted and the inverted demodulator output signals (for example by peak value rectification) and by thereafter selecting the highest value from these two peak values, for example by means of a diode circuit—this highest peak value being used to control the attenuator. An efficient further embodiment of the invention is characterized in that a peak value rectifier having a capacitor circuit is arranged behind the absolute value generating portion of the circuit, the time constant for charging and discharging the capacitor differing considerably from one another.

DESCRIPTION OF THE DRAWINGS

The invention will now be further explained by way of example with reference to the accompanying drawings in which.

DESCRIPTION OF THE PREFERRED EMBODIMENT

Figure 1:
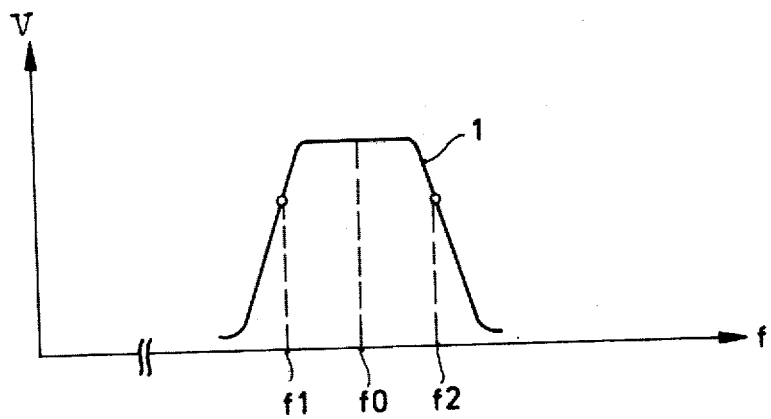
FIG. 1 is the passband response curve of the intermediate frequency filter.
Figure 2:
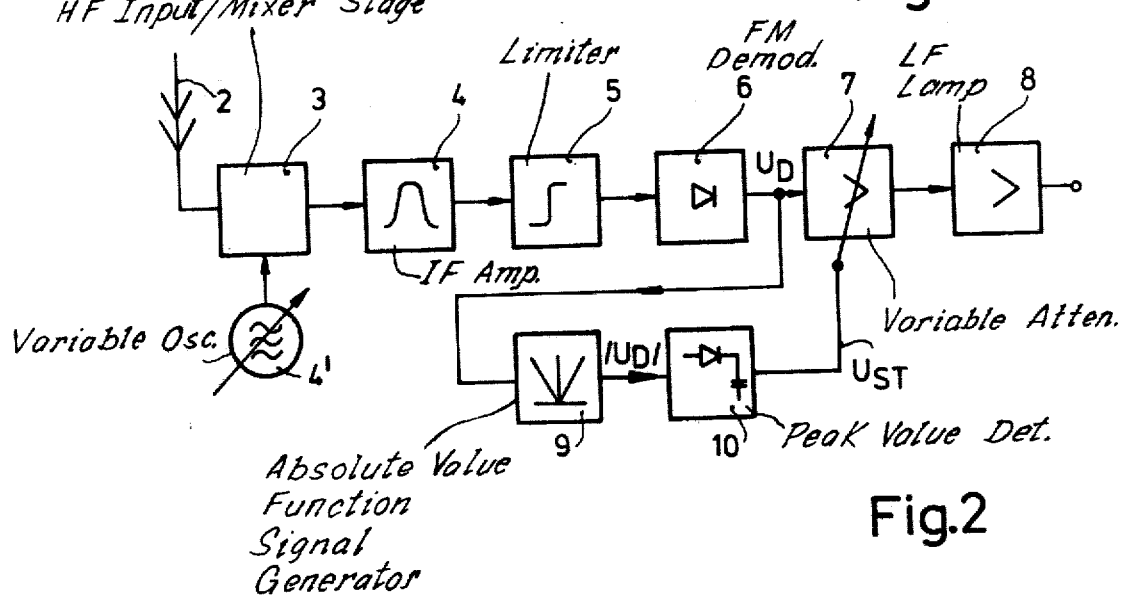
FIG. 2 is a block schematic diagram of a receiver comprising a circuit for attenuating disturbing noise signals, FIG. 3, including a–f, shows the demodulator output voltage and the amount thereof for different tuning conditions.

In the receiver shown in FIG. 2 the signals received by the aerial 2 are applied to a high-frequency input and mixer stage 3 and mixed there with the signal supplied by a tunable oscillator 4'. The output signal of the high-frequency input and mixer stage 3 is filtered and amplified by an intermediate frequency amplifier 4. Connected to the output of the intermediate frequency amplifier 4 there is a limiter 5, the output signal of which is applied to a FM demodulator 6, which supplies an output signal which depends on the difference between the input frequency of the demodulator 6 and the central frequency f0 (see FIG. 1) of the filter in the intermediate frequency amplifier 4 and the demodulator 6, respectively. When the carrier frequency of the received transmitter, which is converted to the intermediate frequency range, does not accurately coincide with the central frequency f0, the demodulator output signal comprises, in addition to the desired and low-frequency signals, respectively, a further d.c. voltage component which depends on the deviation of the carrier frequency relative to f0.

The bandwidth of the intermediate frequency filter is smaller than the bandwidth of the FM demodulator 6. The filter edges are very steep—for example because ceramic filters are used—so that in the case of spurious reception very large distortions occur which may become very audible. The limiter 5 has been designed such that the noise signals occurring when there is no transmitter signal are amplified and limited. This causes also the surge of noise to be very loud.

In the signal channel an attenuator 7 is arranged between the demodulator 6 and a low-frequency amplifier 8. The increasing and decreasing of the attenuation of this attenuator 7, which is, for example in the form of a multiplier circuit, depends on the control voltage $U_{ST}$ at its control input and varies preferably continuously. This is in contrast to the circuit according to the German Offenlegungsschrift No. 2,602,908 in which the attenuation is switched from zero to a maximum value by means of a switch. The control voltage $U_{ST}$ is produced by a circuit for the attenuation of disturbing noise signals, which is connected to the output of the FM demodulator 6 and which consists of an absolute value function signal generator circuit 9 and a subsequent peak value detector 10. The circuit 9 generates the absolute value of the demodulator output signal, that is to say that the demodulator output signal, which may have a positive and a negative polarity, depending on the time, is converted into a signal which has only one polarity, for example the positive polarity. The relationship between the amount of the input signal and the output signal is preferably linear but may alternatively be non-linear, so that inter alia a two-quadrant squaring element might alternatively be used. In principle, the peak value detector 10 may be a peak value rectifier, consisting of a diode and a capacitor, in which different time constants are present for charging and discharging, as will be further described hereinafter.

The operation of the circuit for the attenuation of disturbing noise signals in accordance with the invention will be explained with reference to the FIGS. 3a to 3f. FIG. 3a shows the demodulator output signal in the case of spurious reception, that is to say when two transmitter signals are received which have their respective carrier frequencies f1 and f2 located at either side of the central frequency and generally on the filter edges. The demodulator output signal is represented by the solid lines in FIG. 3a. The dotted lines with which the curves continue above and below the zero line show how the demodulator output signal would vary as a function of the time if one or the other one of the two transmitter signals were not present. FIG. 3b shows, as a function of the time, the variation of the output signal of the circuit 9, that is to say the absolute value of the demodulator output signal $U_D$. The peak value $U_P$ is then far above a threshold value $u_s$. The difference between the peak value and the threshold value can be used to attenuate the useful signal by means of the attenuator 7.

The results in the case of spurious reception, the case when only one of the two transmitters with the carrier frequency f1 or f2 (FIG. 1) is received, can be easily derived from the FIGS. 3a and 3b. Then, the top and bottom portions, respectively, of the curve in FIG. 3a no longer apply so that the demodulator signal is obtained from the sequence of curve portions above en below, respectively, the zero line, these portions being alternately represented by a solid and a dotted line. The output signal shows already then greater distortions with respect to the static tuning, i.e. the frequency spacing between f1 or f2 and f0, is the greater. When this detuning is still further increased relative to the situation shown in FIG. 3a, interferences may occur in the region of the highest instantaneous values, so that the distortions increase still further to a considerable extent.

The variations of the absolute value of the demodulator output voltage, set at the output of the circuit 9 versus the time can be derived from FIG. 3b when one of the two sinusoidal curves is omitted, these curves being composed from solid and dotted portions. It can be seen that also the peak value $U'_p$ occurring in this case is far above the threshold value, so that the attenuation in the useful signal can be controlled in correspondence with the difference between the peak value $u'_p$ and the threshold value.

FIG. 3c shows the variation of the demodulator output signal $U_D$ versus the time in the case of noise surging, that is to say when no transmitter signal is received, which might be limited by the limiter 5. As the bandwidth of an intermediate frequency filter must be considerably larger than double the maximum frequency deviation of the frequency-modulated signal, and the deviation of the instantaneous frequency of the noise signal with respect to the center frequency f0 may be larger than the maximum frequency deviation and as, as mentioned hereinbefore, the limiter 5 limits the input amplitudes of the noise signal at the FM demodulator 6, the output signal of the demodulator may then reach values which are considerably higher than in the case that a transmitter signal is received. From FIG. 3d, which shows the time-dependent variation of the amount of the demodulator output signal $U_D$ as a function of the time, in the case of noise surging it can be seen that also here the peak value $u_p$ is higher than the threshold value $u_s$.

FIG. 3e shows the demodulator output voltage $U_D$ as a function of the time on accurate tuning to a properly receivable transmitter. In this case the carrier frequency coincides with the central frequency f0 of the intermediate frequency filter and of the FM demodulator, respectively. FIG. 3f shows the absolute value of the demodulator output voltage and it is shown that the peak value $u_p$ is lower than the threshold value. In the case of slight detuning, the sinusoidal output signal shifts either upwards or downwards which results in that, after absolute value generation, the amplitudes of the first third, fifth etc. half-wave either increase or decrease, respectively, while the amplitudes of the second, fourth, sixth etc. half-wave vary in the respective opposite direction. As this detuning increases, the peak value of the even or the odd half-waves reaches the peak value, thereby starting the attenuation.

Figure 4:
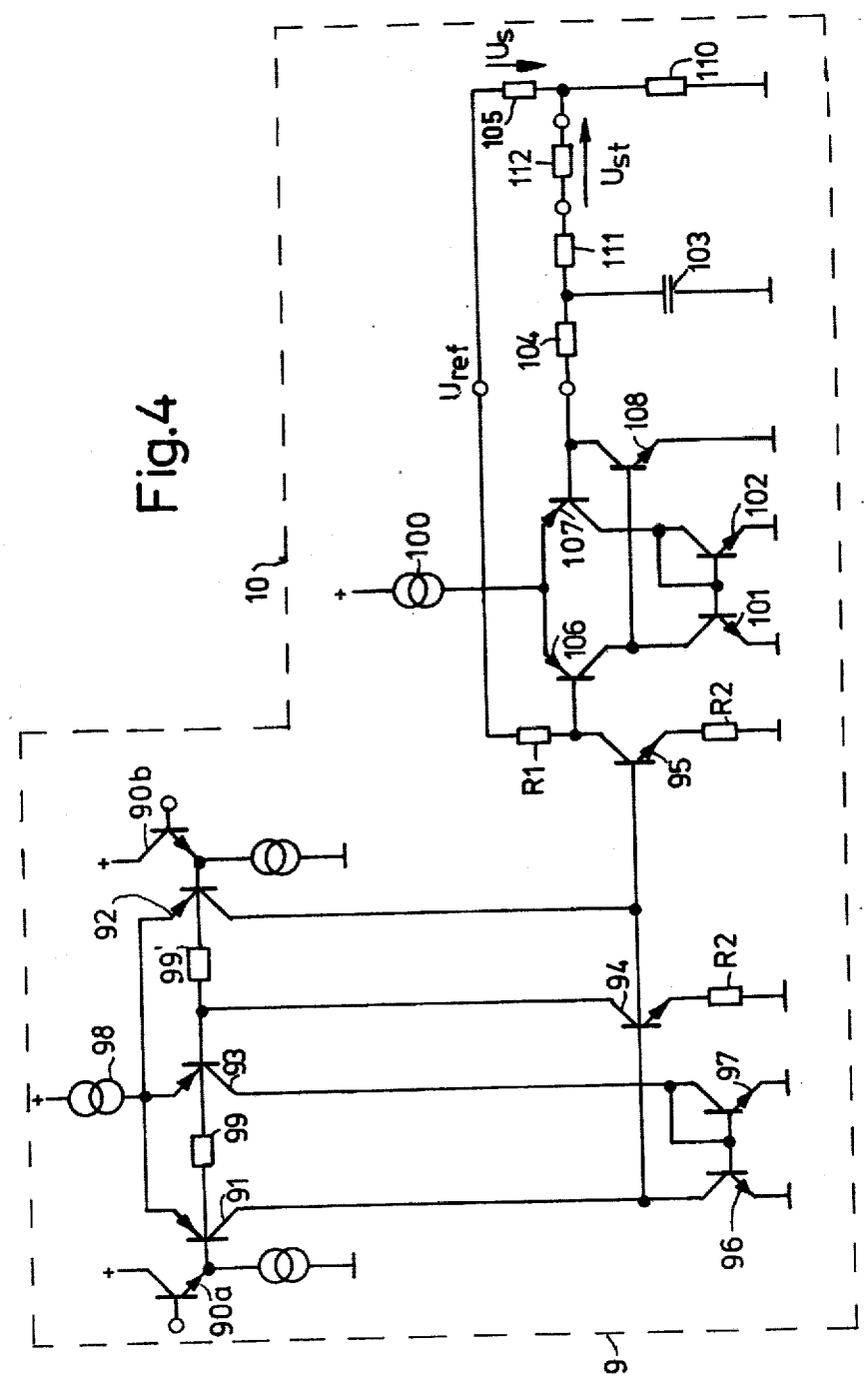
FIG. 4 shows the construction of an absolute value function signal generator circuit and a peak value detector, implemented in integrated circuit technique.

FIG. 4 shows a circuit configuration which is suitable for implementation in integrated circuit technique. Two emitter followers 90a and 90b, of an identical construction to whose bases the demodulator output signal is applied in a differential mode, are connected by means of their emitters to the inputs of a differential amplifier. The differential amplifier comprises two transistors 91 and 92, whose bases are connected to the emitters of the transistors 90a and 90b, respectively, and whose emitters and collectors are interconnected. A current source 98 is included in the common emitter lead of the transistors 91 and 92 and a current mirror is included in the common collector lead thereof. The current mirror is comprised of the transistors 96 and 97, the transistor 96 being connected by means of its collector to the collectors of the transistors 91 and 92, by means of its emitter to ground and by means of its base to the base of the transistor 97 of the same conductivity type (npn). The emitter of the transistor 97 is connected to ground and its collector is short-circuited to the base and is also connected to the collector of a transistor 93, the emitter of which is connected to the emitters of the transistors 91 and 92 and the base of which is connected to the bases of the transistors 91 and 92 via resistors 99 and 99', respectively, which have the same values. The common collector junction point of the transistors 91 and 92 is connected to the base of a further transistor 94, which is of the npn type, the collector of which being connected to the base of the transistor 93 and the emitter to ground by way of an emitter resistor R2.

When the instantaneous value of the voltage at the demodulator output is zero, the two transistors 91 and 92 carry the same collector current and the transistor 94 ensures that the collector current applied by transistor 93 to the transistor 97 is about twice as large as the current through either of the transistors 91 or 92. When the demodulator output signal differs from zero, the base potential at the base of the emitter follower 90a then being, for example, positive with respect to the base potential at the base of 90b, the transistor 91 remains conductive (its collector current increasing then), whereas the transistor 92 is rendered non-conductive. The current through the transistor 93 then becomes as large as the current through the transistor 91 and the transistor 94 forms, together with the transistor 93 and the current mirror 96, 97, a negative feedback loop. This ensures that the current through the transistor 96, 97 is always at least approximately of the same value. The base potential of the transistor 93 is of the same value as the base potential of the transistor 91, so that the total input voltage of the differential amplifier, that is to say the total demodulator output voltage is present across the resistor 99'. The current which corresponds with such a voltage drop across the resistor 99' must be produced by the transistor 94, that is to say the collector current of the transistor 94 corresponds to the quotient of the demodulator output voltage and the value of the resistor 99'. The same situation occurs when the polarity of the demodulator output voltage changes, the difference being that the transistor 92 then becomes conductive and the transistor 91 is rendered non-conductive and the collector current of the transistor 94 then flows through the resistor 99.

So the collector current of the transistor 94 is proportional to the absolute value of the demodulator output voltage. In principle it is possible to evaluate the current through the transistor 94 itself; however, in certain cases it may be more efficient to use a further transistor 95 of the same conductivity type (npn), the base of which being connected to the base of the transistor 94 and the emitter to ground via a resistor R2, which has the same value as the resistor via which transistor 94 is connected to ground. When a collector resistor R1 of the transistor 95 has the same value as one of the resistors 99 or 99', the voltage drop across the collector resistor R1 is equal to the absolute value of the demodulator output voltage.

In principle, the generator absolute value function signal circuit 9 described so far operates in the same manner as the rectifier bridge in the circuit according to the German Offenlegungsschrift No. 2,602,908. The circuit according to the invention has, however, several advantages because the voltage drop across the resistor R1 is substantially as large as the absolute value of the demodulator output voltage and does not become dependent on the temperature due to voltage decreases across the diode transistor 97 and the base-emitter paths, respectively. In addition, it is possible to decouple the output signal (in the voltage drop across the resistor R1) electrically from the demodulator output and to adapt it to the requirements of the subsequent circuit. Finally, the circuit can be easily implemented in integrated circuit technology.

The voltage drop across the resistor R1, whose end opposite from the collector of the transistor 95 is connected to the positive d.c. voltage $u_{ref}$, is applied to the peak value detector 10 as the control signal. The peak value detector 10 comprises a differential amplifier consisting of two pnp-transistors 106 and 107. The emitters of the transistors 106 and 107 are interconnected and connected to a positive d.c. voltage by way of a current source 100. The base of the transistor 106 is connected to the collector of the transistor 95. The collector of the transistor 106 is connected to the collector of an npn-transistor 101, the emitter of which is connected to ground and the base to the base of a further npn-transistor 102. The emitter of the transistor 102 is also connected to ground, whereas its base and its collector are short-circuited (so the transistor operates as a diode) and connected to the collector of the transistor 107. The common collector lead of the transistors 106 and 101 is connected to the base of a npn-transistor 108, the emitter of which is connected to ground and the collector to the base of the transistor 107. The collector of the transistor 108 and the base of the transistor 107, respectively, are connected by way of a resistor 104 to a capacitor 103, the second terminal of which is connected to ground. The junction point of the capacitor 103 and the resistor 104 is connected by way of resistors 111 and 112 to the tap of a voltage divider, which is formed by the resistors 105, 110 and resistor 110 being connected to ground while resistor 105 is connected to the voltage $U_{ref}$.

As long as the absolute value of the demodulator output voltage, which is applied to R1, absolute value is smaller than the voltage drop across the resistor 105, the transistor 107 conducts and the transistor 106 is non-conductive so that no current flows through transistor 108 and there is no current through resistors 104, 111 and 112. In this case the capacitor 103 is in the fully charged condition. Across this capacitor there is a d.c. voltage $U_{ref}$ multiplied by the voltage divider ratio of the voltage divider 105, 110.

Figure 5:
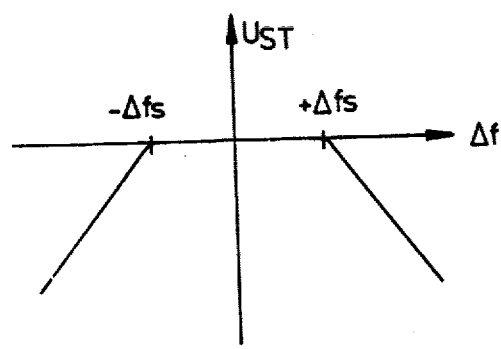
FIG. 5 shows the variation of the control signal as a function of the maximum value of the instantaneous value of the tuning.
Figure 3:
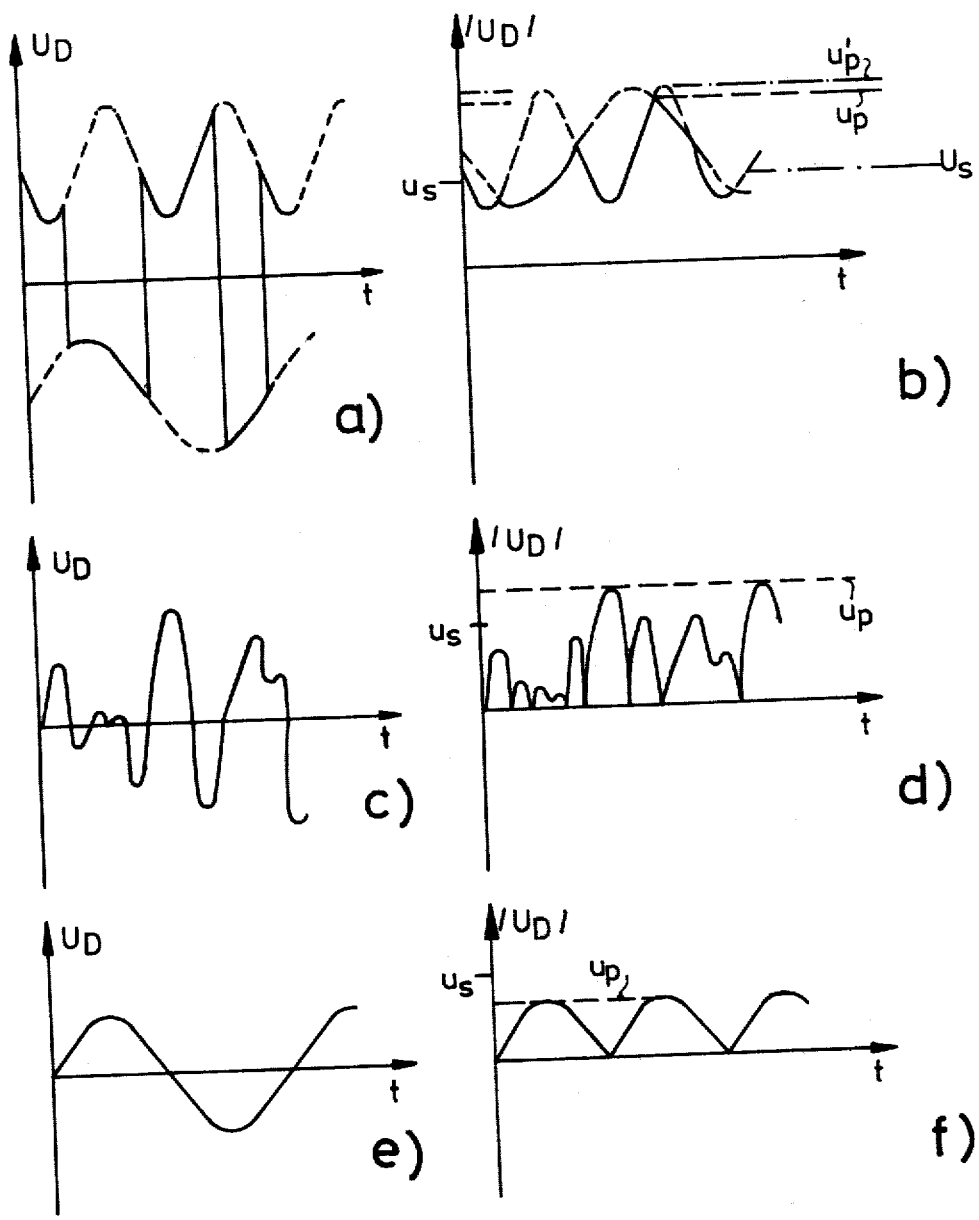

The voltage divider ratio has been chosen so that the voltage drop across the resistor is the threshold value $u_s$ (see FIG. 3). So the voltage $U_{ref} - u_s$ is then present at the capacitor 103. The voltage drop across the resistor 112, which is the control voltage $U_{ST}$ for the attenuator 7 (FIG. 2) is then zero. When the absolute value of the demodulator output voltage and consequently the voltage drop across the resistor R1 exceeds the threshold value $u_s$, the transistor 106 becomes conductive and takes over a portion of the current supplied by the current source 100. As soon as the current through the transistor 106 exceeds the current through the transistor 107, the difference between the currents flows into the base of the transistor 108 and renders this transistor 108 conductive so that the base of the transistor 107 is electrically coupled to the base of the transistor 106 and the current through the transistor 102 becomes almost equally large as the current through the transistor 101. The capacitor 103 is then discharged by way of the resistor 104 and the collector-emitter path of the transistor 108. The greater the demodulator output voltage, that is to say the greater the amount by which the frequency of the demodulator input signal deviates from the central frequency f0, the greater the discharge of the capacitor 103 and the higher the control voltage $U_{ST}$, for which it then holds that: $U_{ST} = u_s - /U_D/$. FIG. 5 shows the variation of the control voltage $U_{ST}$ as a function of the instantaneous detuning Δf (i.e. the difference between the instantaneous value of the frequency of the input signal of the demodulator and the central frequency). It will be seen that, until a detuning of ±Δfs, which corresponds to the threshold value $u_s$ and which, for FM reception, is at approximately 125 KHz, the control voltage has the value zero. Above this threshold value the amount of the control voltage increases linearly versus the detuning. To this end, the attenuator 7, to which this control voltage is applied, must be of such a construction that, at an increase of the amount of the control voltage, the attenuation increases continuously from a minimum value upwards. The variation of the current distribution at a differential amplifier may, for example, be used in dependence on an applied control signal.

From the above it will be apparent that the capacitor 103 discharges when the peak value of the demodulator output voltage absolute value increases and that it is charged again when the peak value of this absolute value decreases again. Consequently, the discharge time constant, which is predominantly determined by the resistor 104, must be considerably smaller than the charging time constant, which is determined by the resistors 111 and 112 and the parallel arrangement of the resistors 105 and 110. Advantageous results are accomplished with a discharging time constant of 3 msec and a charging time constant of 200 msec.

The circuit shown in FIG. 4 has the advantage that the control voltage $U_{ST}$—and consequently also the attenuation—is equally large (0 V) in the case of an accurate tuning to a transmitter as for the case in which a maximum value of the detuning has (almost) reached the threshold value Δfs. This facilitates the evaluation of the signal in such a receiving condition.

Compared with the prior art circuits, a circuit for the attenuation of disturbing noise signals according to the invention has the further advantage that the circuit for the attenuation of disturbing noise signals becomes already operative at lower aerial input voltages. Another advantage with respect to circuits for the attenuation of disturbing noise signals, in which the noise is suppressed in dependence on a field strength—dependent voltage, is that the noise is evaluated after demodulation, so that the start of the attenuation is independent of the level of the aerial input voltage. Therefore, when, for FM receivers of the same type, the gain of the aerial signal and the intermediate frequency signal, respectively, is spread or when such receivers are used sometimes with and sometimes without aerial amplifiers, this has no influence on the starting point of the attenuation of the circuit for the attenuation of disturbing noise signals in accordance with the invention. The circuit according to the invention is comparatively simple as only one voltage (the voltage of the FM demodulator) must be evaluated.

What is claimed is:

1. A circuit for attenuating noise signals in an FM receiver, having an FM-demodulator coupled to a variable attenuator having a control input, wherein the output signal from said FM-demodulator is also applied to an absolute value function signal generator having an output signal from which a control signal for said variable attenuator is derived, which controls signal increases the attenuation of said variable attenuator when the absolute value of the demodulator output signal rises above a threshold level, characterized in that said circuit further comprises means coupled to the control input of said variable attenuator for generating a variable control signal dependent on the absolute value of said demodulator output signal when said absolute value exceeds said threshold level, said control signal having a first and a second time constant associated respectively with an increase or a decrease in the the absolute value output signal, said second time constant being considerably larger than said first time constant.

2. A circuit as claimed in claim 1, characterized in that said generating means comprises a peak value rectifier having a capacitor circuit (103) arranged subsequent to the absolute value function signal generator, the time constants for charging and discharging the capacitor considerably differing from one another.

3. A circuit as claimed in claims 1 or 2, characterized in that the second time constant with which the control signal ($U_{ST}$) follows a decrease in the absolute value ($u_p$, $u'_p$) is at least five times and preferably twenty times larger than the first time constant with which the control signal ($U_{ST}$) follows an increase in the absolute value ($u_p$, $u'_p$).

4. A circuit as claimed in one of the claims 1 or 2, characterized in that the generating means is constructed so that the control signal does not considerably decrease below the value it takes when the absolute value reaches the threshold value ($u_s$).

5. A circuit as claimed in claim 1, characterized in that the absolute value function signal generator comprises a differential amplifier having two transistors (91, 92) whose emitters and collectors are respectively interconnected, a third transistor (93) whose emitter is connected to the emitters of the differential amplifier transistors (91, 92) and whose base is connected via two resistors (99, 99'), which have the same resistance values, to the base of each one of the differential amplifier transistors, and whose collector is connected via a current mirror to the interconnected collectors of the differential amplifier transistors, a fourth transistor (94) of the opposite conductivity type as said third transistor, having a collector also connected to the base of said third transistor and to whose base the difference between the collector currents of the two differential amplifier transistors (91, 92) and the collector current of the third transistor (93) via the current mirror is applied; wherein the third transistor (93) and the fourth transistor (94) form in conjunction with the current mirror (96, 97) a negative feedback loop and wherein the collector current of the fourth transistor (94) or of a fifth transistor (95), which is arranged, with respect to the base and the emitter thereof, in the same manner as the fourth transistor, is used as the output signal.

6. A circuit as claimed in claim 2, characterized in that the peak value rectifier comprises a differential amplifier which includes a first and a second transistor (106, 107); a current mirror to which the collector currents of the first and the second transistor (106, 107) are applied, the current flowing in the current mirror being determined by the collector current of the second transistor; and a third transistor (108) of the opposite conductivity type as said first and second transistor, the collector of which being connected to the base of the second transistor (107), the base of which being connected to the collector of the first transistor (106), wherein the base of the first transistor (106) is the input of the peak value rectifier and the base of the second transistor (107) is connected to the capacitor circuit (103).

* * * * *